(12) United States Patent
Doyle et al.

(10) Patent No.: US 9,652,583 B2
(45) Date of Patent: May 16, 2017

(54) METHODS AND APPARATUS TO AUTOMATICALLY FABRICATE FILLERS

(71) Applicant: The Boeing Company, Chicago, IL (US)

(72) Inventors: Joseph D. Doyle, Mount Pleasant, SC (US); Ronald J. Collins, Brier, WA (US); Joel Adriance, Arlington, WA (US)

(73) Assignee: THE BOEING COMPANY, Chicago, IL (US)

( * ) Notice: Subject to any disclaimer, the term of this patent is extended or adjusted under 35 U.S.C. 154(b) by 393 days.

(21) Appl. No.: 14/502,755

(22) Filed: Sep. 30, 2014

(65) Prior Publication Data

US 2016/0091888 A1 Mar. 31, 2016

(51) Int. Cl.
*G06F 17/50* (2006.01)
*G05B 19/4097* (2006.01)

(52) U.S. Cl.
CPC ..... *G06F 17/5086* (2013.01); *G05B 19/4097* (2013.01); *G06F 17/5095* (2013.01); *G05B 2219/45052* (2013.01)

(58) Field of Classification Search
CPC .. G06F 17/50; G06F 17/5018; G06F 17/5086; G06F 17/5095; G05B 19/4097; Y02T 10/82
See application file for complete search history.

(56) References Cited

U.S. PATENT DOCUMENTS 2,138,876 A * 12/1938 Novak ................ D03D 1/0094
106/36
4,420,341 A * 12/1983 Ferrigno ................... C09C 3/08
106/457
5,017,314 A * 5/1991 Zemanek .............. F16L 59/161
264/112

(Continued)

OTHER PUBLICATIONS

De Groot, "Unusual techniques for absolute distance measurement," Jan. 2001, 5 pages, Society of Photo-Optical Instrumentation Engineers, Optical Engineering, vol. 40, No. 1, pp. 28-32.

(Continued)

*Primary Examiner* — Crystal J Barnes-Bullock
(74) *Attorney, Agent, or Firm* — Hanley, Flight & Zimmerman, LLC

(57) ABSTRACT

Methods and apparatus to automatically fabricate fillers are disclosed. An example method includes aligning rigid surface data with flexible surface data, the rigid surface data and the flexible surface data being permitted to overlap when aligned; when aligned, defining the rigid surface data and the flexible surface data based on a same parameter space; calculating a displacement function based on differences between corresponding ones of first points in the flexible surface data and second points in the rigid surface data; determining a modified position of a first one of the first points by modifying the first one of the first points based on a value of the displacement function; calculating a gap between the modified position of the first one of the first points and a second one of the second points; and creating (Continued)

a physical filler to fill a physical gap corresponding to the calculated gap.

20 Claims, 12 Drawing Sheets

(56) References Cited

U.S. PATENT DOCUMENTS

| | | | | |
|---|---|---|---|---|
| 2008/0029682 A1* | 2/2008 | Binnard | ............... | G03F 7/707 |
| | | | | 248/638 |
| 2014/0149903 A1* | 5/2014 | Ahn | ............... | G06F 3/0488 |
| | | | | 715/765 |
| 2015/0294032 A1* | 10/2015 | Lagally | ............... | G06F 17/50 |
| | | | | 703/1 |
| 2016/0305759 A1* | 10/2016 | Reese | ............... | G01D 5/24 |

OTHER PUBLICATIONS

Nozaki et al., "787 wing skin automatic 3D measurement system with Laser Radar," Hitachi Engineering & Services Co., Ltd., Jul. 2008, 44 pages.
Karaolani et al., "A Finite Element Method for Deformable Models," 1989, 6 pages, Intelligent Systems Group, Department of Computer Science, University of Reading, RG6 2AX, UK.
U.S. Appl. No. 14/252,997, filed Apr. 15, 2014, 59 pages.

* cited by examiner

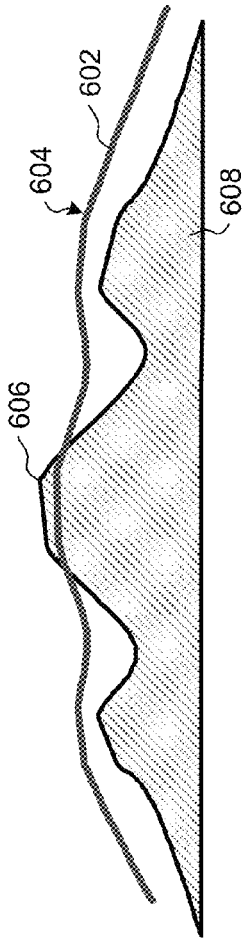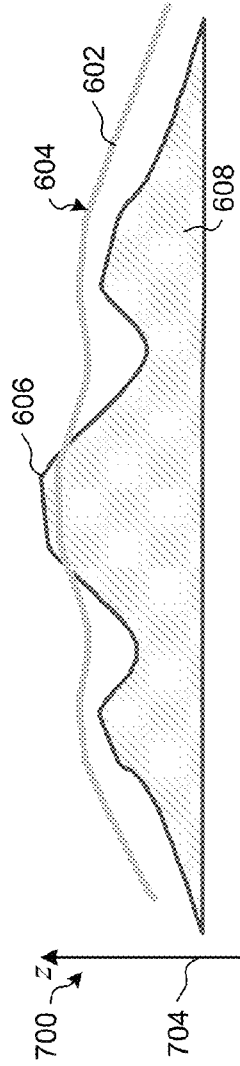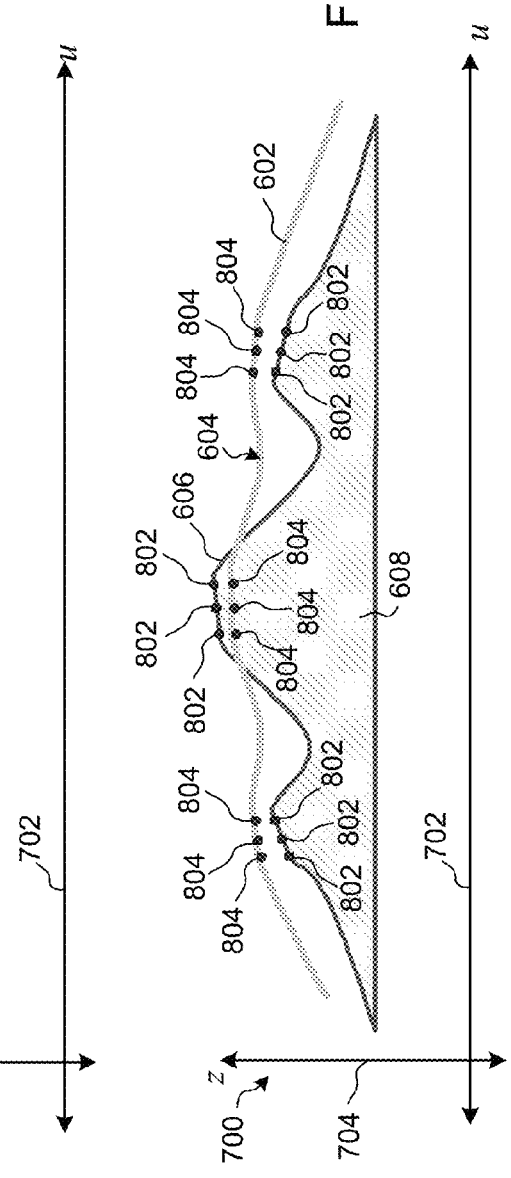

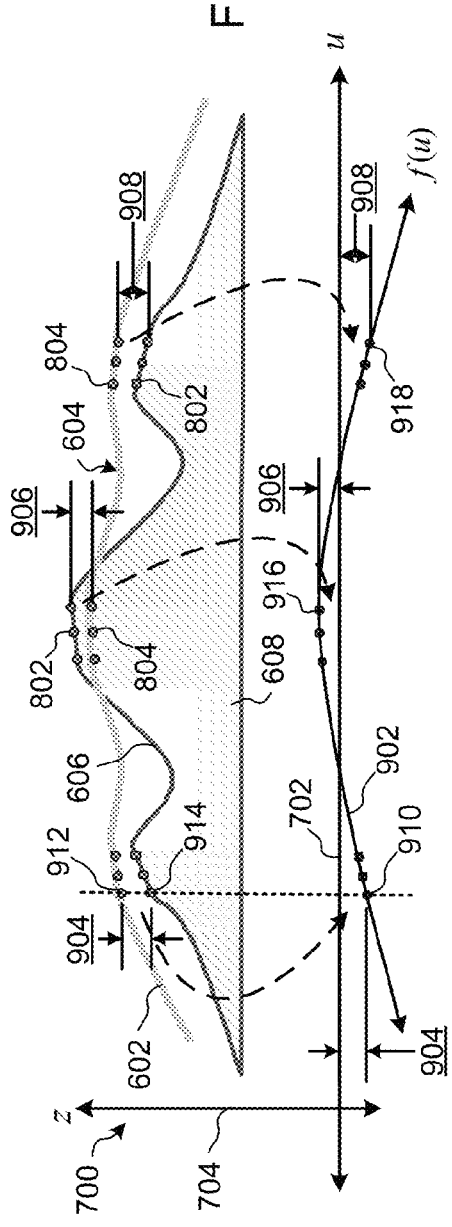
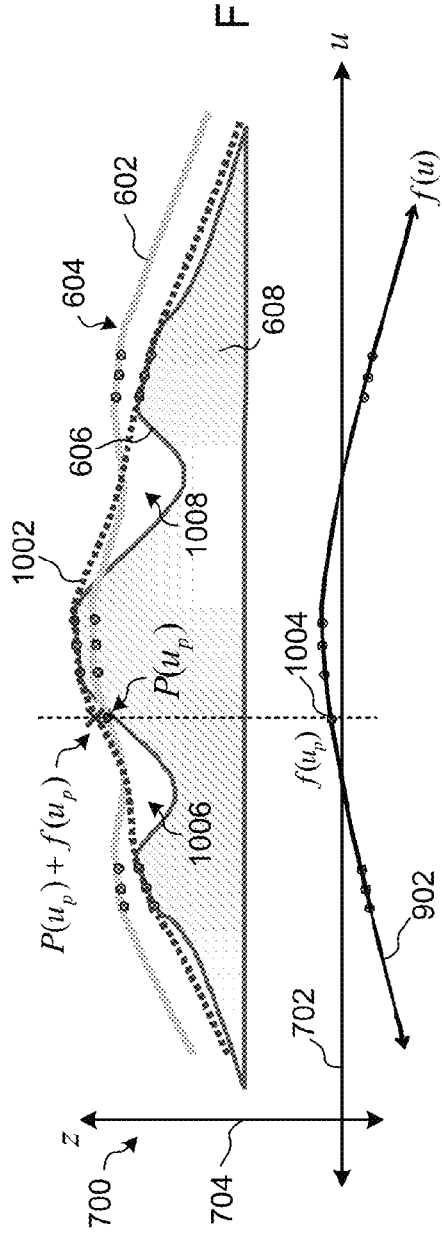

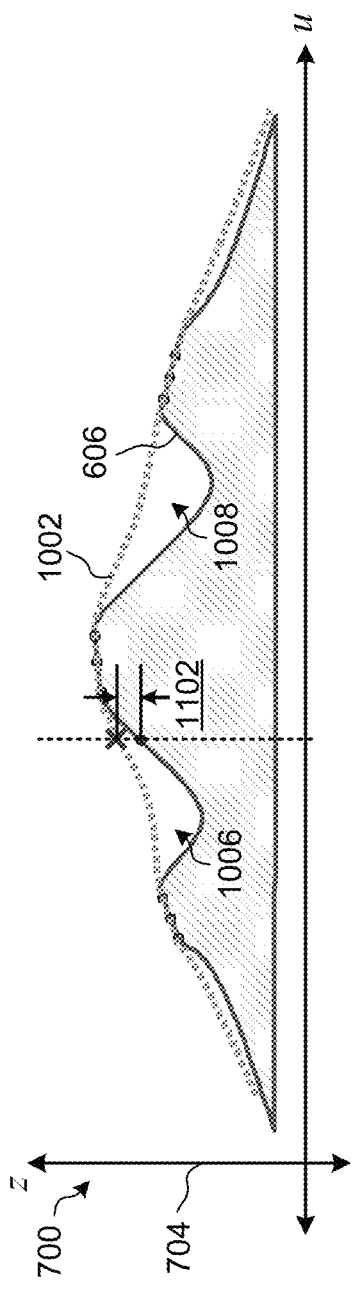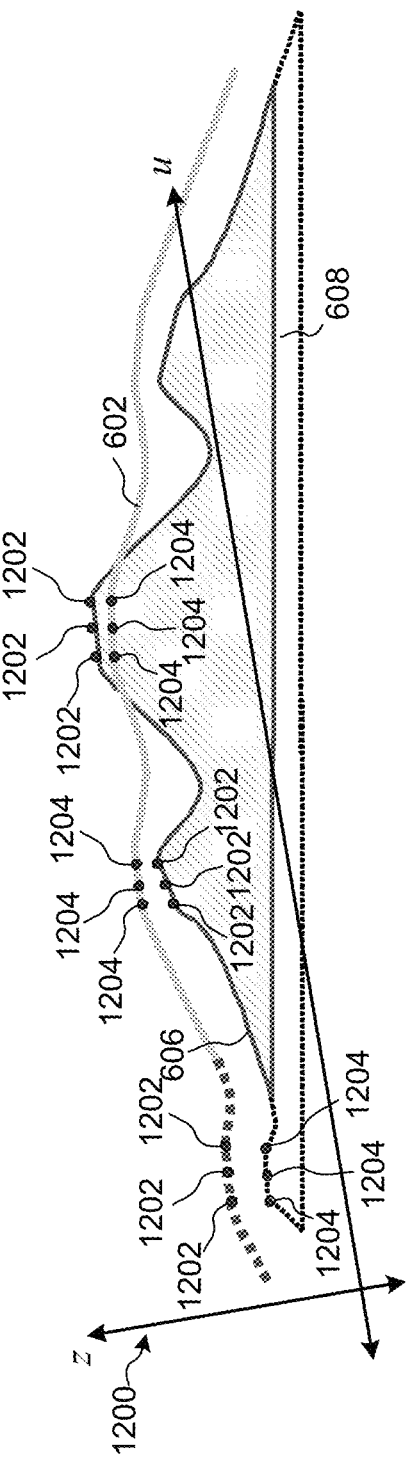

METHODS AND APPARATUS TO AUTOMATICALLY FABRICATE FILLERS

FIELD OF THE DISCLOSURE

This disclosure relates generally to manufacturing, and, more particularly, to methods and apparatus to automatically fabricate fillers.

BACKGROUND

Surfaces may be mated when components are attached or assembled together during the manufacturing of an object. In some cases, one or more gaps may be present between the mated surfaces. These gaps may affect the performance, aesthetic, and/or some other aspect of the object in an undesired manner. Thus, it may be desirable to substantially fill these gaps to, for example, avoid undesired deformation and/or to enhance structural support of the mated surfaces.

SUMMARY

Example methods disclosed herein include aligning rigid surface data with flexible surface data, the rigid surface data and the flexible surface data being permitted to overlap when aligned; when aligned, defining the rigid surface data and the flexible surface data based on a same parameter space; calculating, using the processor, a displacement function within the parameter space based on differences between corresponding ones of first points in the flexible surface data and second points in the rigid surface data; determining a modified position of a first one of the first points in the flexible surface data by modifying the first one of the first points based on a value of the displacement function at a location corresponding to the first one of the first points; calculating a gap between the modified position of the first one of the first points and a second one of the second points corresponding to the first one of the first points; and creating a physical filler to fill a physical gap corresponding to the calculated gap.

Example apparatus disclosed herein include a data aligner, a parameter definer, a function calculator, a surface data modifier, a gap calculator, and a filler fabricator. The data aligner aligns rigid surface data with flexible surface data, the rigid surface data and the flexible surface data being permitted to overlap when aligned. The parameter definer defines a parameter space and to redefine the rigid surface data and the flexible surface data based on the parameter space. The function calculator calculates a displacement function within the parameter space based on differences between corresponding ones of first points in the flexible surface data and second points in the rigid surface data. The surface data modifier determines a modified position of a first one of the first points in the flexible surface data by modifying the first one of the first points based on a value of the displacement function at a location corresponding to the first one of the first points. The gap calculator calculates a gap between the modified position of the first one of the first points and a second one of the second points corresponding to the first one of the first points. The filler fabricator creates a physical filler to fill a physical gap corresponding to the calculated gap.

BRIEF DESCRIPTION OF THE DRAWINGS

FIG. 6 is a side view of aligning an example flexible surface that is to be joined with an example rigid surface.

FIG. 7 illustrates an example parameter space that may be defined or constructed to define fillers to be installed between the flexible surface and the rigid surface of FIG. 6.

FIG. 8 illustrates example reference points defined for the example rigid surface of FIG. 6 and example pull up points defined for the example flexible surface of FIG. 6 that correspond to the reference points.

FIG. 9 illustrates an example of fitting a displacement function to displacements between corresponding ones of the example reference points and the example pull up points of FIG. 8.

FIG. 10 illustrates an example of predicting a morphed position of the flexible surface based on the function of FIG. 9.

FIG. 11 illustrates an example of determining gaps between the flexible surface and the rigid surface of FIGS. 6-10 when mated for use in constructing fillers to fill the gaps.

FIG. 12 illustrates another example parameter space, another set of reference points, and another set of pull up points for determining additional gaps between the example flexible surface and the example rigid surface of FIGS. 6-11.

The figures are not to scale. Wherever appropriate, the same reference numbers will be used throughout the drawing(s) and accompanying written description to refer to the same or like parts.

DETAILED DESCRIPTION

Examples disclosed herein provide a geometric solution for predicting gaps that remain when flexible structures are fabricated such that only certain regions are in continuous contact when assembled. Examples disclosed herein may be used to, for example, design and fabricate fillers for filling gaps between a flexible surface (e.g., sheet metal to form a skin of an aircraft) and a rigid surface (e.g., a rib assembly used to provide the structure and shape of an aircraft wing).

In examples in which the following conditions apply, example methods and apparatus disclosed herein provide filler dimensions that more accurately reflect the gap between the surfaces than when such conditions do not apply: 1) when the derivative of the displacement function $(f_u)$ is considered to be linear, the flexible surface behaves in a similar linear fashion; and 2) the nominal surfaces to be mated are relatively flat such that the overall error as derived from the equation $\epsilon_s(u_p)=S(u_p-\epsilon_u(u_p))-S(u_p)$ is less than the acceptable process tolerance allocation for the data analysis portion of the predictive process, where $\epsilon_u(u)$ is the different in the u value (e.g., position) between corresponding locations on mating surfaces due to curvature relative to the u-axis (e.g., positional axis) as a function of u (e.g., flatness), $\epsilon_s(u)$ is the error due to a local surface shape (e.g., roughness), and S(u) is a function describing the measured data with at least a threshold fidelity.

In some examples disclosed herein, the surfaces to be mated (e.g., a flexible surface and a rigid surface, two flexible surfaces, etc.) are measured during and/or prior to assembly. In other examples, measurements of the surfaces to be mated are determined using three-dimensional models of the surfaces. In some examples, the measurements of the surfaces include measurements of indexing features for aligning the surfaces.

In some examples disclosed herein, the surfaces are geometrically assembled by creating a continuous displacement function (or pull-up function) for a set of contact points. In some examples, the displacement function is used to virtually modify at least one of the surfaces such that the designated contact points are virtually brought into contact with corresponding contact points of the other surface, and intermediate points (e.g., non-contact points) are morphed, deflected, or otherwise modified according to the displacement function. Example methods and apparatus disclosed herein calculate the gaps between the surfaces as modified to determine appropriate filler shapes.

Figure 1:
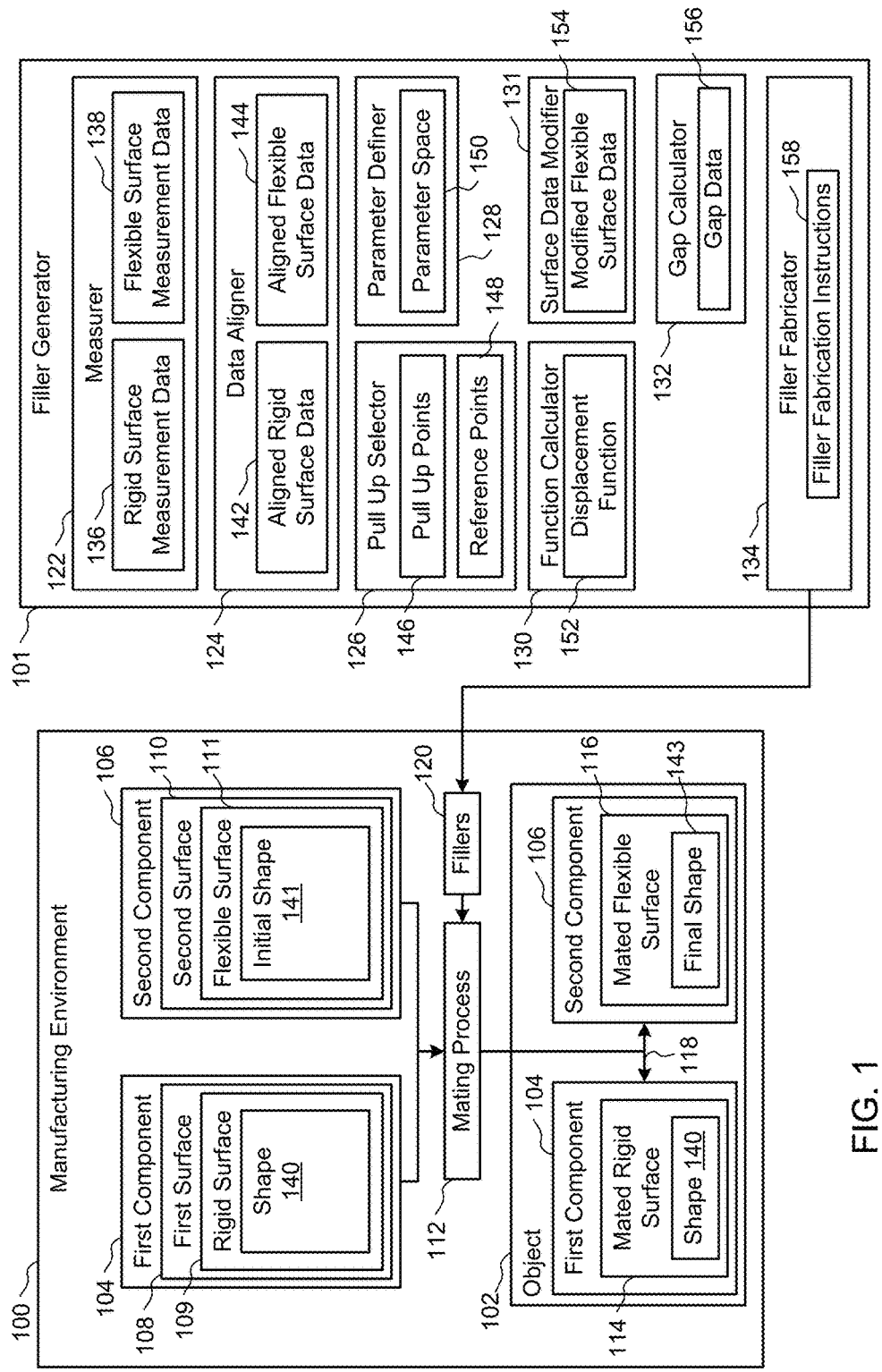
FIG. 1 is a block diagram of an example manufacturing environment and an example filler generator constructed in accordance with the teachings of this disclosure to dynamically construct fillers for filling gaps between mated surfaces.

FIG. 1 is a block diagram of an example manufacturing environment 100 and an example filler generator 101 constructed in accordance with the teachings of this disclosure to dynamically construct fillers for filling gaps between parts. In the example of FIG. 1, the manufacturing environment 100 is an example of an environment in which an object 102 is manufactured (e.g., fabricated, assembled, etc.).

The example object 102 of FIG. 1 may be manufactured using at least a first component 104 and a second component 106. Any number of other components may also be used to form the object 102. The first component 104 has a first surface 108 and the second component 106 has a second surface 110. As used herein, a "surface" may be a continuous surface and/or a discontinuous surface including multiple surfaces separated by discontinuities.

The example second component 106 is attached to the first component 104 such that the second surface 110 of the second component 106 is mated with the first surface 108 of the first component 104. In particular, the first surface 108 of the first component 104 and the second surface 110 of the second component 106 are mated using a mating process 112.

The example mating process 112 of FIG. 1 may include any number of operations configured to physically attach the second component 106 to the first component 104 such that the second surface 110 of the second component 106 is mated with the first surface 108 of the first component 104. For example, the mating process 112 may include at least one of securing, bonding, mounting, welding, fastening, pinning, stitching, stapling, tying, gluing, and/or otherwise attaching the first component 104 to the second component 106.

At least one of the first component 104 or the second component 106 is flexible, such that the corresponding surface of the other component 104, 106 is a flexible surface. In this manner, at least one of the first surface 108 or the second surface 110 is a flexible surface. For example, the first surface 108 of FIG. 1 includes a rigid surface 109 that may be mated with a flexible surface 111 of the second surface 110 to form a mated rigid surface 114 and a mated flexible surface 116. In other examples, the first surface 108 also includes a flexible surface, such that the flexible surface of the first surface 108 is mated with the flexible surface 111 of the second surface 110.

In some examples, the rigid surface 109 is sufficiently stiff or inflexible such that it is unable to be bent, deformed, and/or flexed in a manner outside of selected tolerances. Consequently, the shape of the rigid surface 109 may not be modifiable outside of selected tolerances.

In contrast, the example flexible surface 111 may be bent, deformed, and/or flexed without causing substantial undesired effects to the second component 106 and/or to the flexible surface 111, such as cracking or tearing. Consequently, the shape of flexible surface 111 is easily modifiable.

As used herein, a "shape" of a surface, such as the first surface 108 or the second surface 110, may include the geometry of the surface, the dimensions of the surface, the contour of the surface, and/or the deflection of the surface. In particular, the shape of a surface may be the three-dimensional shape of the surface.

The rigid surface 109 and the flexible surface 111 of FIG. 1 are mated by the mating process 112 to form the mated rigid surface 114 and the mated flexible surface 116, respectively. In particular, in the fully mated state, the rigid surface 109 is referred to herein as the mated rigid surface 114 and flexible surface 111 may be referred to as the mated flexible surface 116.

One or more spaces 118 (or gaps) may be present between mated rigid surface 114 and mated flexible surface 116. In the example manufacturing environment 100 of FIG. 1, fillers 120 are used to fill the spaces 118 (e.g., completely fill the spaces 118 within selected tolerances). In the example of FIG. 1, the fillers 120 may take the form of a number of shims. The fillers 120 may be fabricated or otherwise manufactured using materials and/or a combination of materials including, for example, plastic, metal, a metal alloy, wood, a composite material, stone, or other materials.

In some examples, the fillers 120 are manufactured prior to the mating process 112 in a different location than where mating process 112 is performed and/or to reduce the time, cost, and/or effort associated with manufacturing the object 102 using the fillers 120.

Figure 2:
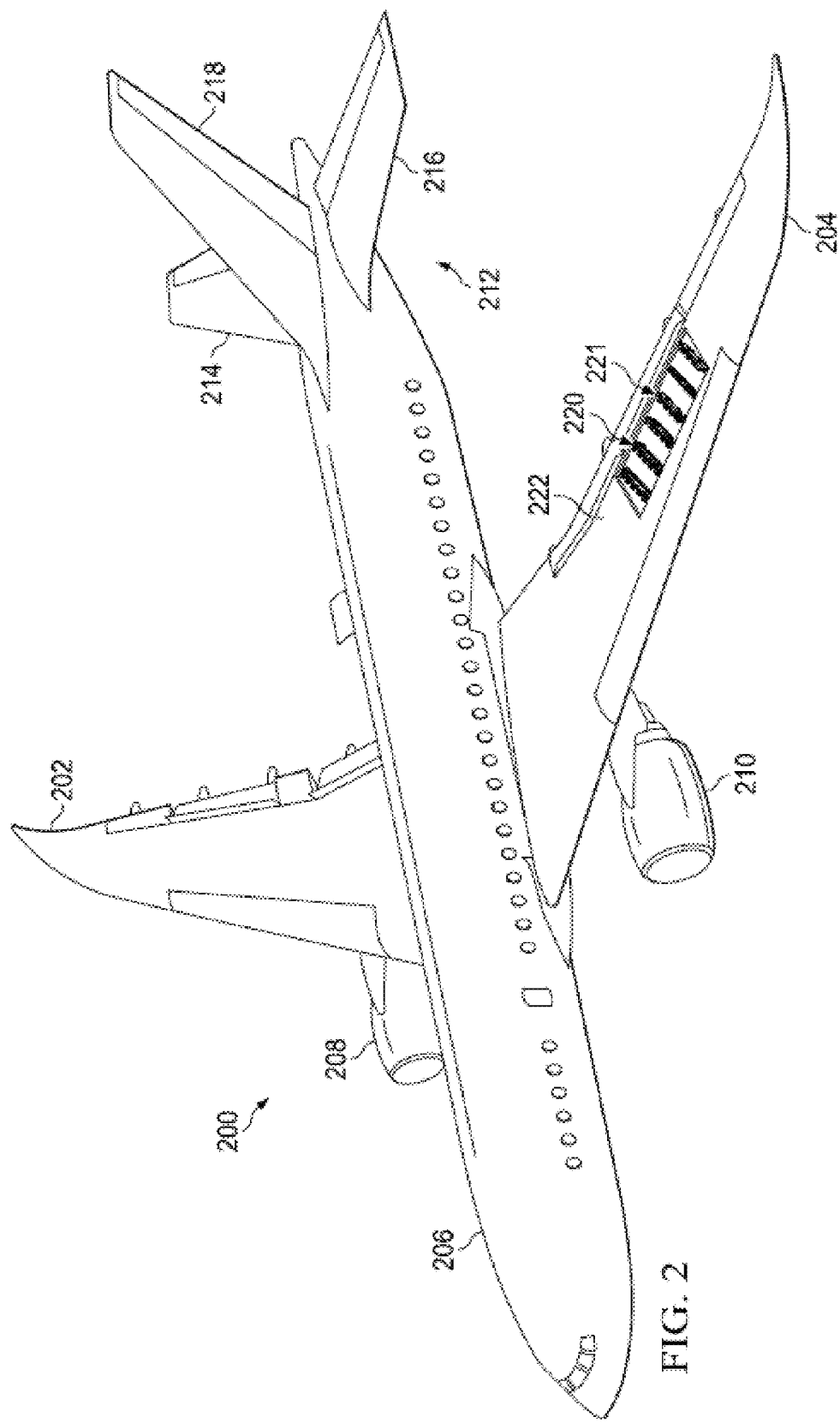
FIG. 2 illustrates an example aircraft for which fillers may be dynamically constructed.

FIG. 2 illustrates an example aircraft 200 for which the fillers 120 (or shims) may be automatically fabricated during construction of the aircraft 200. In this example, the aircraft 200 has a right wing 202 and a left wing 204 attached to a body 206. The aircraft 200 also includes engines 208 and 210 attached to the wings 202 and 204. The body 206 has a tail section 212. A right horizontal stabilizer 214, a left horizontal stabilizer 216, and a vertical stabilizer 218 are attached to the tail section 212 of the body 206.

The left wing 204 of the aircraft 200 is an example of the object 102 of FIG. 1. A portion of the wing 204 has been cutaway to expose a portion of a wing structure 220 of the wing 204. The wing structure 220 may also be referred to as a wing box.

The wing structure 220 includes a rib assembly 221. A first panel 222 is attached to the rib assembly 221. The first panel 222 may also be referred to as a skin or a wing skin. The rib assembly 221 is an example the first component 104 in FIG. 1, and the first panel 222 is an example of the second component 106 in FIG. 1.

Figure 3:
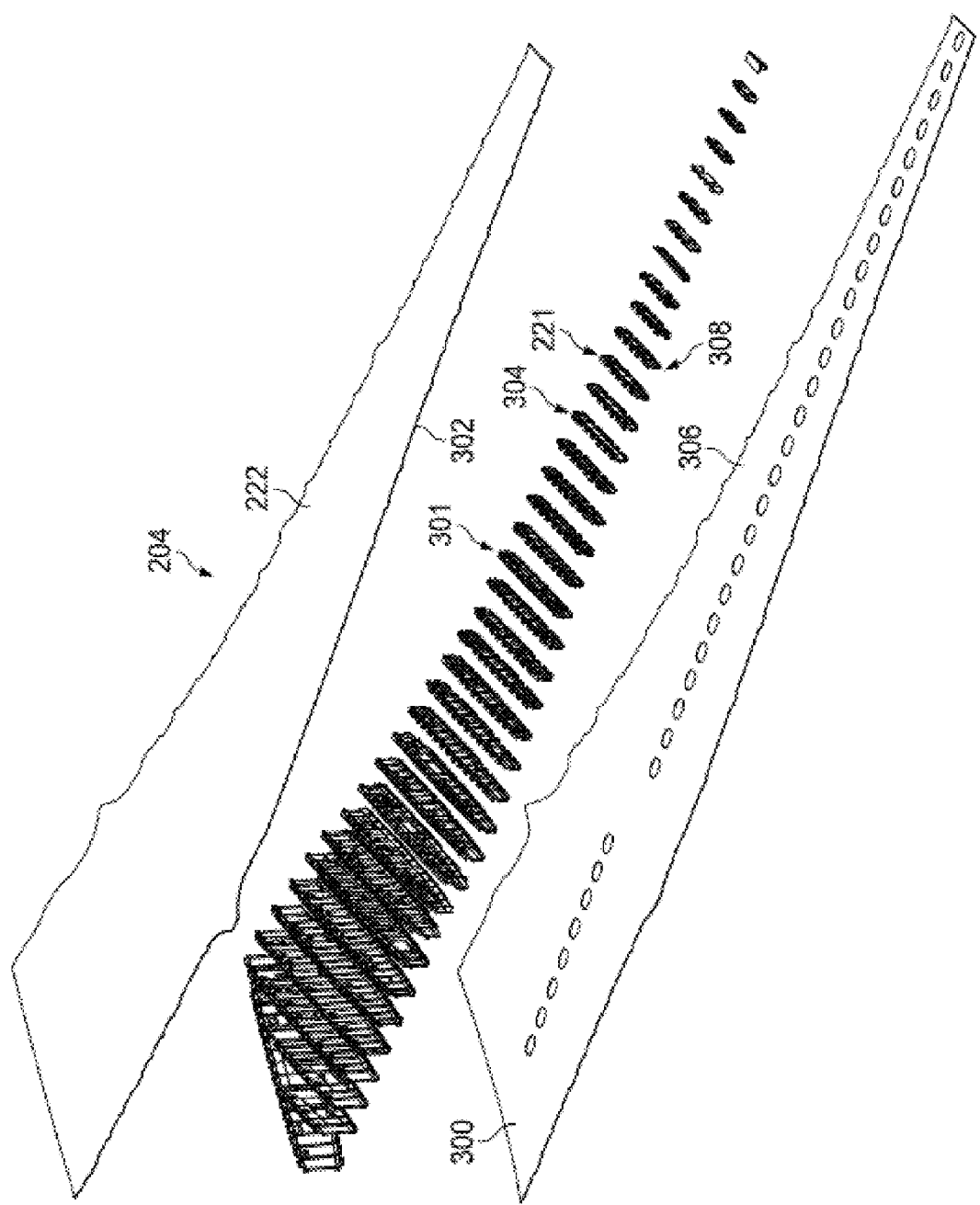
FIG. 3 is an illustration of an exploded view of a portion of a wing of the example aircraft of FIG. 2.

FIG. 3 is an illustration of an exploded view of a portion of the left wing 204 of the example aircraft 200 of FIG. 2. In the example of FIG. 3, the rib assembly 221, the first panel 222, and a second panel 300 are shown. As depicted, the rib assembly 221 includes multiple ribs 301.

In the example of FIG. 3, the first panel 222 has a flexible surface 302, which may be mated with a rigid surface 304 of rib assembly 221. The panel 300 has a flexible surface 306, which may be mated with another rigid surface 308 of the rib assembly 221. The example rigid surfaces 304, 308 are discontinuous rigid surfaces (e.g., a rigid surface formed by multiple smaller rigid surfaces that are spaced apart).

The flexible surfaces 302 and 306 are examples of the flexible surface 111 of FIG. 1, and the rigid surfaces 304 and 308 are examples of the rigid surface 109 of FIG. 1.

Figure 4:
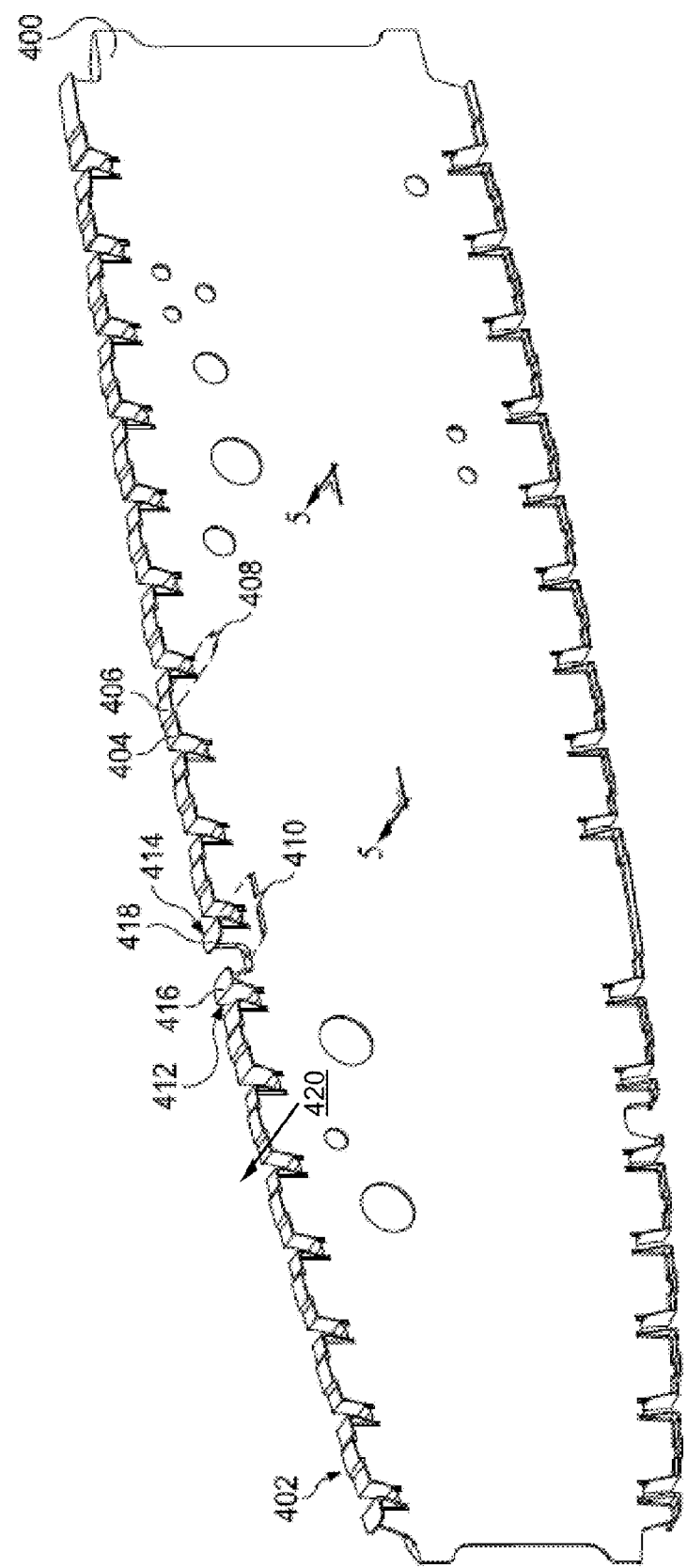
FIG. 4 is an isometric view of a rib in a rib assembly of the example wing of FIG. 3.

FIG. 4 is an isometric view of a rib 400 in the rib assembly 221 of the example left wing 204 of FIGS. 2 and 3. In the example of FIG. 4, the rib 400 is an example one of the ribs 301 of FIG. 3. The rib 400 shown in FIG. 4 has multiple shear ties 402.

Each of the shear ties 402 has at least one surface that forms the rigid surface 308 shown in FIG. 3. A shear tie 404 is an example one of the shear ties 402. As shown in FIG. 4, the shear tie 404 has a surface 406. The first panel 222 shown in FIGS. 2 and 3 may be attached to the shear tie 404 to mate the flexible surface 302 of the first panel 222 to the surface 406 at a selected portion of the shear tie 404. This selected portion of the shear tie 404 may be referred to as a cap 408 of the shear tie 404. In particular, the first panel 222 may be tacked to the cap 408 to mate the flexible surface 302 of the first panel 222 with the surface 406.

A shear tie 410 is another example one of the shear ties 402. The shear tie 410 includes a flange 412 and a flange 414. The flange 412 has a surface 416 and the flange 414 has a surface 418. The first panel 222 shown in FIGS. 2 and 3 may be attached to the flange 412 and the flange 414 to mate the first panel 222 to the surface 416 and the surface 418, respectively. For example, the first panel 222 may be tacked (e.g., tack fastened) to the flange 412 and to the flange 414 to mate the first panel 222 to the surface 416 and the surface 418, respectively.

Figure 5:
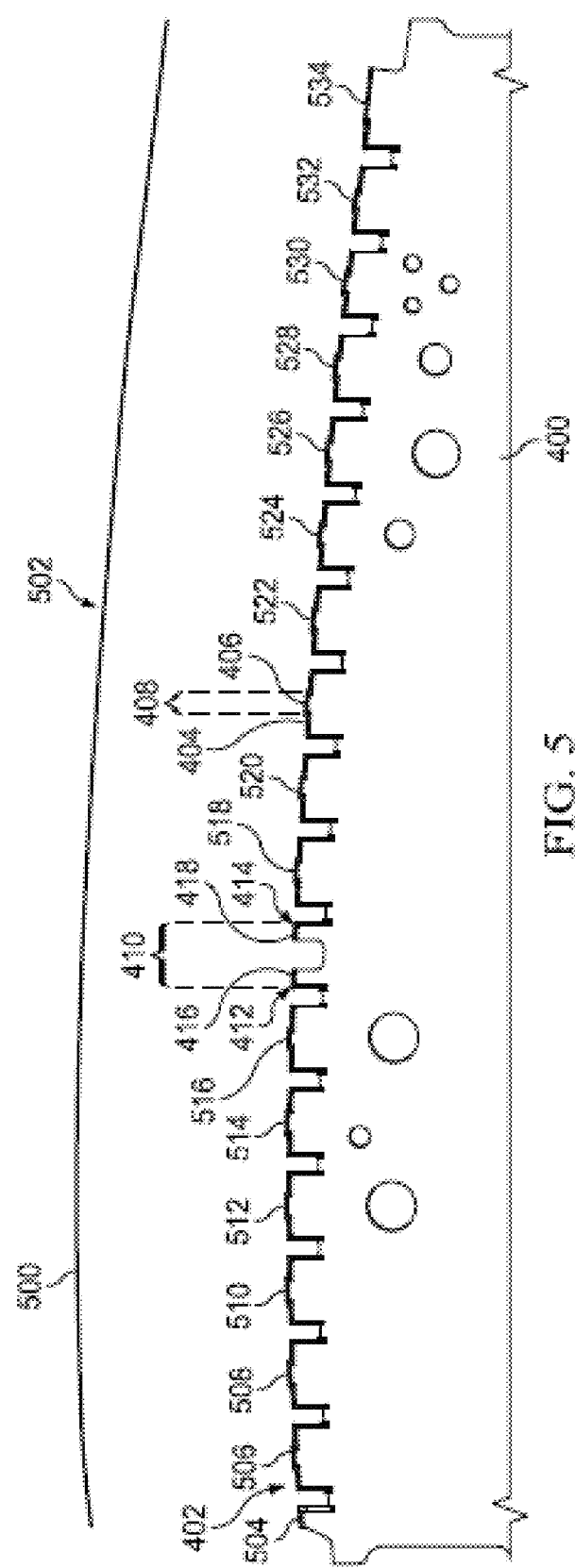
FIG. 5 is an illustration of a front view of the example rib of FIG. 4.

FIG. 5 is an illustration of a front view of the example rib 400 of FIG. 4. In the example of FIG. 5, a surface line 500 corresponds to a cross-sectional shape 502 of the portion of the flexible surface 302 of FIG. 3 to be mated to the surfaces of the shear ties 402.

In addition to being mated to the surface 406, the surface 416, and the surface 418 as shown in FIG. 5, this portion of the flexible surface 302 of FIGS. 3 and 4 is also to be mated to surfaces 504, 506, 508, 510, 512, 514, 516, 518, 520, 522, 524, 526, 528, 530, 532, and 534. The example flexible surface 302 may be fastened to the surfaces 504-534 using any number of fastener devices or elements. For example, the fastener devices or elements may include tacks, pins, nails, screws, bolts, and/or any other type of fastener device. Fastening the flexible surface 302 to these surfaces, as well as gravity and other factors, may cause the cross-sectional shape 502 indicated by the surface line 500 to change.

Returning to FIG. 1, the example filler generator 101 may be used to predict a final shape (e.g., the cross-sectional shape 502) of the portion of flexible surface 302 after fastening has been performed. Further, the filler generator 101 may be used to determine the shapes of the fillers 120, or shims, that will be needed to substantially fill any undesired spaces or gaps between the flexible surface 302 and the surfaces 406 of the shear ties 402.

These undesired spaces may need to be filled to reduce or avoid stresses due to fastener installation, to reduce and/or avoid deformation due to pull up of the surfaces being fastened, and/or to maintain a desired aerodynamic profile for the left wing 204. For example, if such spaces are not substantially filled within selected tolerances, loads applied to the first panel 222 during flight of the aircraft 200 may cause the first panel 222 to deform in an undesired manner at the locations of these spaces. Such deformation may, in turn, change the aerodynamic profile of the left wing 204 in an undesired manner.

The example filler generator 101 of FIG. 1 generates the fillers 120 for use in the mating process 112. The example filler generator 101 of FIG. 1 may be located in, near, or distanced from the example manufacturing environment 100. The filler generator 101 includes a measurer 122, a data aligner 124, a pull up selector 126, a parameter definer 128, a function calculator 130, a surface data modifier 131, a gap calculator 132, and a filler fabricator 134.

The example measurer 122 of FIG. 1 generates rigid surface measurement data 136 representative of the rigid surface 109. The measurer 122 also generates flexible surface measurement data 138 representative of the flexible surface 111. The rigid surface measurement data 136 includes data about a shape 140 of the rigid surface 109. The flexible surface measurement data 138 includes data about an initial shape 141 of the flexible surface 111. After the mating process 112, the mated flexible surface 116 has a final shape 143 that is different from the initial shape 141 of the flexible surface 111.

In some examples, the rigid surface measurement data 136 and/or the flexible surface measurement data 138 take the form of three-dimensional (3D) point clouds. In particular, the rigid surface measurement data 136 may take the form of a first 3D point cloud that has sufficient density to capture the shape 140 of the rigid surface 109 with a desired level of accuracy. Similarly, the flexible surface measurement data 138 may take the form of a second 3D point cloud that has sufficient density to capture the initial shape 141 of the flexible surface 111 with a desired level of accuracy.

In some examples, the measurer 122 includes a scanning device that is used to scan the rigid surface 109 to generate the rigid surface measurement data 136 and to scan the flexible surface 111 to generate the flexible surface measurement data 138. Examples of scanning devices include a laser system, an optical measurement device, or some other type of system. The laser system may be, for example, a laser radar scanner. The optical measurement device may be, for example, a 3D optical measurement device. In some other examples, the measurer 122 includes a photogrammetry system that takes measurements from photographs of the rigid surface 109 and/or the flexible surface 111. Additionally or alternatively, the measurer 122 may determine the rigid surface measurement data 136 and/or the flexible surface measurement data 138 using models of the rigid surface 109 and/or the flexible surface 111. However, actual measurements of the rigid surface 109 and/or the flexible surface 111 using a scanning device may result in more accurate representations of the rigid surface 109 and/or the flexible surface 111.

In some examples, the rigid surface 109 and/or the flexible surface 111 are relatively thin in one dimension. As used herein, the term "thin" as used with reference to a dimension of rigid surface 109 and/or the flexible surface 111 refers to the length of that dimension being substantially less (e.g., 20% or less, an order of magnitude or less, or any other appropriate threshold) than the length of the other dimension of the surface. In some examples, a dimension of the rigid surface 109 and/or the flexible surface 111 is considered to be "thin" when the surface does not substantially deflect in that dimension. For example, the rib 400 of FIG. 4 may be considered to be thin in a direction 420. Therefore, the dimension corresponding to the direction 420 can be ignored and the rib 400 can be modeled according to its cross-section as shown in FIG. 5.

The example data aligner 124 of FIG. 1 aligns the rigid surface measurement data 136 with the flexible surface measurement data 138. For example, the data aligner 124 virtually aligns the rigid surface measurement data 136 with the flexible surface measurement data 138 such that the data points in the rigid surface measurement data 136 are relatively close to corresponding data points in the flexible surface measurement data 138, where the data points represent respective points on the rigid surface 109 and the flexible surface 111. In examples in which the rigid surface 109 and/or the flexible surface 111 are determined to be thin, the data aligner 124 aligns the data points in the rigid surface measurement data 136 and the flexible surface measurement data 138 in the non-thin dimensions, effectively treating the rigid surface measurement data 136 and the flexible surface measurement data 138 as two-dimensional objects. The example data aligner 124 may modify one or both of the rigid surface measurement data 136 or the flexible surface measurement data 138, by translating, scaling, and/or rotating the rigid surface measurement data 136 and/or the flexible surface measurement data 138 to align the data. The aligned data is referred to as aligned rigid surface data 142 and aligned flexible surface data 144.

The data aligner 124 may perform alignment based on index points or alignment points identified by the measurer 122. For example, the measurer 122 may identify and/or measure the locations at which fasteners are to attach the flexible surface 111 to the rigid surface 109. Any other index or alignment points may be identified and/or measured for use in aligning the surfaces 109, 111.

In the example of FIG. 1, the data aligner 124 permits the rigid surface data and the flexible surface data to overlap when virtually aligned. As a result, the example data aligner 124 can reduce (e.g., minimize) the distances between corresponding points to reduce the complexity of subsequent calculations.

FIG. 6 is a side view of aligning an example flexible surface 602 of a first part 604 (e.g., the example flexible surface 302 of the first panel 222 of FIG. 3) that is to be joined with an example rigid surface 606 of a rigid part 608 (e.g., the example rigid surfaces 304, 308 of the example rib assembly 221 of FIGS. 2 and 3, the example rigid surfaces 406 of the example ribs 400 of FIG. 4). The example data aligner 124 of FIG. 1 determines a closest fit between the flexible surface 602 and the rigid surface 606, while permitting the flexible surface 602 and the rigid surface 606 to overlap (a configuration that is not achievable in the physical environment).

In the example of FIG. 6, the flexible surface 602 is a portion of a larger flexible surface that extends to the left and right of the illustrated area. Similarly, the rigid surface 606 is a portion of a larger rigid surface that extends to the left and right of the area illustrated in FIG. 6. Therefore, the example data aligner 124 of FIG. 1 may align the flexible surface 602 and the rigid surface 606 based on data outside of the illustrated area and/or based on measured alignment points.

The example pull up selector 126 of FIG. 1 determines pull up points 146 in the aligned flexible surface data 144 that correspond to reference points 148 in the aligned rigid surface data 142. For example, the pull up selector 126 may analyze the aligned rigid surface data 142 to identify the reference points 148 as points that are likely to make contact with the flexible surface when mated. For example, the pull up selector 126 may identify the reference points 148 by extending tangent lines from the data points in the aligned rigid surface data 142 and, when the tangent line does not strike another portion of the rigid surface (e.g., based on the aligned rigid surface data), the corresponding data point may be a reference point. The example pull up selector 126 may reduce a number of the reference points 148 to a number of reference points 148 that represents the applicable contact points.

Additionally or alternatively, the pull up points 146 and/or the reference points 148 may be alignment points or index points measured by the measurer 122 and/or points used for alignment by the data aligner 124.

In some examples, the pull up points 146 and the reference points 148 are selected prior to aligning the flexible surface 602 and the rigid surface 606.

The example filler generator 101 of FIG. 1 analyzes individual sections of the aligned rigid surface data 142 and the aligned flexible surface data 144, rather than analyzing all of the aligned rigid surface data 142 and the aligned flexible surface data 144 at the same time.

To simplify the calculations of gap(s) for a section, the example parameter definer 128 of FIG. 1 defines a parameter space 150 for the aligned rigid surface data 142 and the aligned flexible surface data 144 based on a selected subset of reference points 148 and corresponding pull up points 146. For example, the parameter definer 128 may orient a u-axis based on a first one of the selected reference points 148 (e.g., the left-most reference point when the aligned rigid surface data 142 and the aligned flexible surface data 144 are displayed) and a last one of the selected reference points 148 (e.g., the right-most reference point when the aligned rigid surface data 142 and the aligned flexible surface data 144 are displayed). In some other examples, the parameter definer 128 orients a u-axis by performing a linear regression of the reference points 148 and/or the pull up points 146 to identify a best linear fit. The example parameter definer 128 sets the z-axis of the parameter space 150 based on the orientation of the u-axis (e.g., perpendicular to the u-axis).

The parameter definer 128 redefines the aligned rigid surface data 142 and the aligned flexible surface data 144 based on the parameter space 150. For example, the parameter definer 128 transforms the selected portions of the aligned rigid surface data 142 and the aligned flexible surface data 144 (e.g., including the selected pull up points 146 and the selected reference points 148) from a coordinate system in which the aligned rigid surface data 142 and the aligned flexible surface data 144 are redefined to use the coordinate system of the parameter space 150.

FIG. 7 illustrates an example parameter space 700 that may be defined or constructed to define fillers to be installed between the flexible surface 602 and the rigid part surface 606 of FIG. 6. The example parameter space 700 defines a u-axis 702 and a z-axis 704 perpendicular to the u-axis 702. The example parameter definer 128 may define the parameter space 700 such that the flexible surface 602 (e.g., data points in the aligned flexible surface data 144) does not have duplicate locations on the u-axis 702. The example parameter definer 128 further redefines the data points representing the flexible surface 602 and the rigid part surface 606 to conform to the parameter space 700. In the example of FIG. 7, the flexible surface 602 and the rigid part surface 606 are redefined to have a positive z-offset. The z-offset increases the clarity and depictions of the displacement function in FIGS. 8-10 below, but may be omitted.

FIG. 8 illustrates example reference points 802 (e.g., the reference points 148 of FIG. 1) defined for the example rigid surface 606 of FIG. 6 and example pull up points 804 (e.g., the pull up points 146 of FIG. 1) defined for the example flexible surface 602 of FIG. 6 that correspond to the reference points 802. The example pull up selector 126 of FIG. 1 selects the pull up points 804 such that each of the example pull up points 804 has a corresponding reference point 802 at the location of the pull up point 804 on the u-axis 702. In the example of FIG. 8, there is a one-to-one correspondence between the reference points 802 and the pull up points 804.

The example function calculator 130 of FIG. 1 calculates a displacement function 152 based on differences (or displacements) between corresponding ones of the pull up points 146 in the aligned flexible surface data 144 and the reference points 148 in the aligned rigid surface data 142. In some examples, the function calculator 130 calculates the displacement function 152 by: 1) at the u-axis location of each corresponding pair of the selected pull up points 146 and reference points 148, setting a displacement point (e.g., the value of the displacement function 152) equal to the displacement to be applied to the pull up point 146 to be coincident with the corresponding reference point 148; 2) using least squares error and/or another method to fit an initial curve to the set values in the parameter space 150; and 3) adjusting the initial curve to fit the set values to determine the displacement function 152. In some examples, the function calculator 130 performs piecewise calculation of the displacement function 152 (e.g., calculating the displacement function 152 in sections) to fit the displacement function 152 to all of the displacement points.

FIG. 9 illustrates an example of fitting a displacement 902 function to displacements 904, 906, 908 between corresponding ones of the example reference points 802 and the example pull up points 804 of FIG. 8.

The example function calculator 130 of FIG. 1 calculates a displacement point 910 of the displacement function 902 selects one of the pull up points 804 (e.g., the pull up point 912) and its corresponding reference point 802 (e.g., the reference point 914). The function calculator 130 determines the displacement 904 of the selected reference point 914 with respect to the corresponding pull up point 912. In the example of FIG. 9, the reference point 914 is below the pull up point 912 (e.g., has a lower value within the parameter space 700). Thus, the corresponding displacement point 910 is less than zero (e.g., the pull up point 912 will have to be lowered to meet the reference point 914). The displacement point 910 has a magnitude equal to the displacement between the selected reference point 914 with respect to the corresponding pull up point 912. The function calculator 130 generates additional displacement points 916, 918 for the remaining pairs of reference points 802 and pull up points 804 (e.g., displacements 906 and 908 result in the corresponding displacement points 916 and 918).

When the displacement points 910, 916, 918 have been determined, the example function calculator 130 fits the displacement function 902 to the displacement points 910, 916, 918. For example, the function calculator 130 may attempt to fit a curve to the displacement points 910, 916, 918 using least squares error or another curve fitting technique. Where appropriate (e.g., when an initially-calculated curve does not fit one or more of the displacement points 910, 916, 918 within a configured tolerance), the function calculator 130 splits the curve and/or modifies the curve to fit all of the displacement points 910, 916, 918.

The example surface data modifier 131 determines morphed positions of the aligned flexible surface data 144 by modifying the data points in the aligned flexible surface data 144 based on the corresponding values of the displacement function 152. For example, at each data point in the aligned flexible surface data 144, the example surface data modifier 131 increases or decreases the value of the data point based on the value of the displacement function at the same u-axis value in the parameter space 150 to form modified flexible surface data 154. For example, the surface data modifier 131 selects a data point at location u=2 in the aligned flexible surface data 144, which has a value of 1.5 (as defined in the parameter space 150). The surface data modifier 131 determines that, at location u=2 in the parameter space 150, the value of the displacement function is −0.5. As a result, the surface modifier 131 modifies the value of the data point at location u=2 (e.g., sets the value of the modified flexible surface data 154 at u=2) to be 1.5−0.5=1. The surface modifier 131 repeats this process for the remaining data points in the aligned flexible surface data 144 to generate the modified flexible surface data 154.

FIG. 10 illustrates an example of predicting a morphed position of the flexible surface 602 based on the displacement function 902 of FIG. 9. The example of FIG. 10 includes a morphed surface 1002 (e.g., the modified flexible surface data 154 of FIG. 1). The example surface data modifier 131 determines the morphed surface 1002 by modifying a position $P(u_p)$ of the flexible surface 602 (e.g., a data point in the aligned flexible surface data 144) by a displacement value 1004 (e.g., $f(u_p)$) corresponding to the position u of the flexible surface 602. In FIG. 10, $u_p$ is the u-axis value of the selected data point p, $P(u_p)$ is the value of the aligned flexible surface data 144 at u, and f(u) is the value of the displacement function 902 at u. Thus, the value $P'(u_p)$ of the morphed surface 1002 (e.g., the data point of the modified flexible surface data 154) is $P'(u_p)=P(u_p)+f(u_p)$.

The example surface data modifier 131 calculates the modified positions $P'(u_p)$ for each of the data points p in the aligned flexible surface data 144 (e.g., the selected portion of the flexible surface 602). As shown in FIG. 10, there are gaps 1006, 1008 between the morphed surface 1002 and the rigid surface 606.

The example gap calculator 132 of FIG. 1 calculates gaps (e.g., gap data 156) between the morphed flexible surface (e.g., the modified flexible surface data 154) and the rigid surface (e.g., the aligned rigid surface data 142). For example, the gap calculator 132 calculates the dimensions of the gaps 1006, 1008 of FIG. 10 between the morphed surface 1002 and the rigid surface 606. The gap data 156 describes calculated gaps at each of the data points in the modified flexible surface data 154 and/or the aligned rigid surface data 142. The gap data 156 may include a set of discrete points and/or may be a contiguous function describing the contours of the gaps.

FIG. 11 illustrates an example of determining the gaps 1006, 1008 between the morphed flexible surface 1002 and the rigid surface 606 of FIG. 10 when mated, for use in constructing fillers to fill the gaps 1006, 1008. The example gap calculator 132 calculates a gap 1102 between the morphed flexible surface 1002 and the rigid surface 606 for an example data point at location u. To generate a filler 120 to fill the gap 1006 of FIG. 11, the example gap calculator 132 adds the calculated gap 1102 to a contour of the rigid surface 606. For example, the gap calculator 132 may be provided with data representing the contour of the rigid surface 606 (e.g., the aligned rigid surface data 142), to which the gap calculator 132 may add the gap 1102 at the corresponding location u to determine a height of the filler 120 to fill the gap 1006. In some examples, the gap calculator 132 determines the gaps 1102 at the locations corresponding to the data points in the aligned rigid surface data 142 and then interpolates the gaps between the data points to determine a contiguous or substantially contiguous contour of the resulting filler 120.

The example filler fabricator 134 of FIG. 1 generates filler fabrication instructions 158 to automatically fabricate the fillers 120 based on the gap data 156. For example, the filler fabricator 134 may determine dimensions of a filler 120 to be fabricated using a computer numerical control (CNC) machine, such as a CNC milling or CNC routing machine, a three-dimensional (3D) printer, and/or any other fabrication device. The fabrication of the filler 120 may be based on a type of material to be used in the filler 120, which may be specified in a data file associated with the object 102, the first component 104, the second component 106, and/or the mating process 112. The example filler fabricator 134 generates the filler fabrication instructions 158 to instruct the selected fabrication process. In some examples, the filler fabricator 134 is physically separate from the measurer 122, the data aligner 124, the pull up selector 126, the parameter definer 128, the function calculator 130, the surface data modifier 131, and/or the example gap calculator 132.

FIG. 12 illustrates another example parameter space 1200, another set of reference points 1202, and another set of pull up points 1204 for determining gaps between the example flexible surface 602 and the example rigid surface 606 of FIG. 6. The example reference points 1202 and the example pull up points 1204 include a portion of the example reference points 802 and a portion of the example pull up points 804 of FIG. 8, respectively. The parameter definer 128 defines the different parameter space 1200 based on the selected reference points 1202 and pull up points 1204. The example function calculator 130, the example surface data modifier 131, the example gap calculator 132, and the example filler fabricator 134 then create fillers 120 for gaps corresponding to the selected reference points 1202 and the pull up points 1204 as disclosed above.

While an example manner of implementing the filler generator 110 is illustrated in FIG. 1, one or more of the elements, processes and/or devices illustrated in FIG. 1 may be combined, divided, re-arranged, omitted, eliminated and/ or implemented in any other way. Further, the example measurer 122, the example data aligner 124, the example pull up selector 126, the example parameter definer 128, the example function calculator 130, the example surface data modifier 131, the example gap calculator 132, and the example filler fabricator 134 and/or, more generally, the example filler generator 101 of FIG. 1 may be implemented by hardware, software, firmware and/or any combination of hardware, software and/or firmware. Thus, for example, any of the example measurer 122, the example data aligner 124, the example pull up selector 126, the example parameter definer 128, the example function calculator 130, the example surface data modifier 131, the example gap calculator 132, and the example filler fabricator 134 and/or, more generally, the example filler generator 101 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example, measurer 122, the example data aligner 124, the example pull up selector 126, the example parameter definer 128, the example function calculator 130, the example surface data modifier 131, the example gap calculator 132, and/or the example filler fabricator 134 is/are hereby expressly defined to include a tangible computer readable storage device or storage disk such as a memory, a digital versatile disk (DVD), a compact disk (CD), a Blu-ray disk, etc. storing the software and/or firmware. Further still, the example filler generator 101 may include one or more elements, processes and/or devices in addition to, or instead of, those illustrated in FIG. 1, and/or may include more than one of any or all of the illustrated elements, processes and devices.

Figure 13:
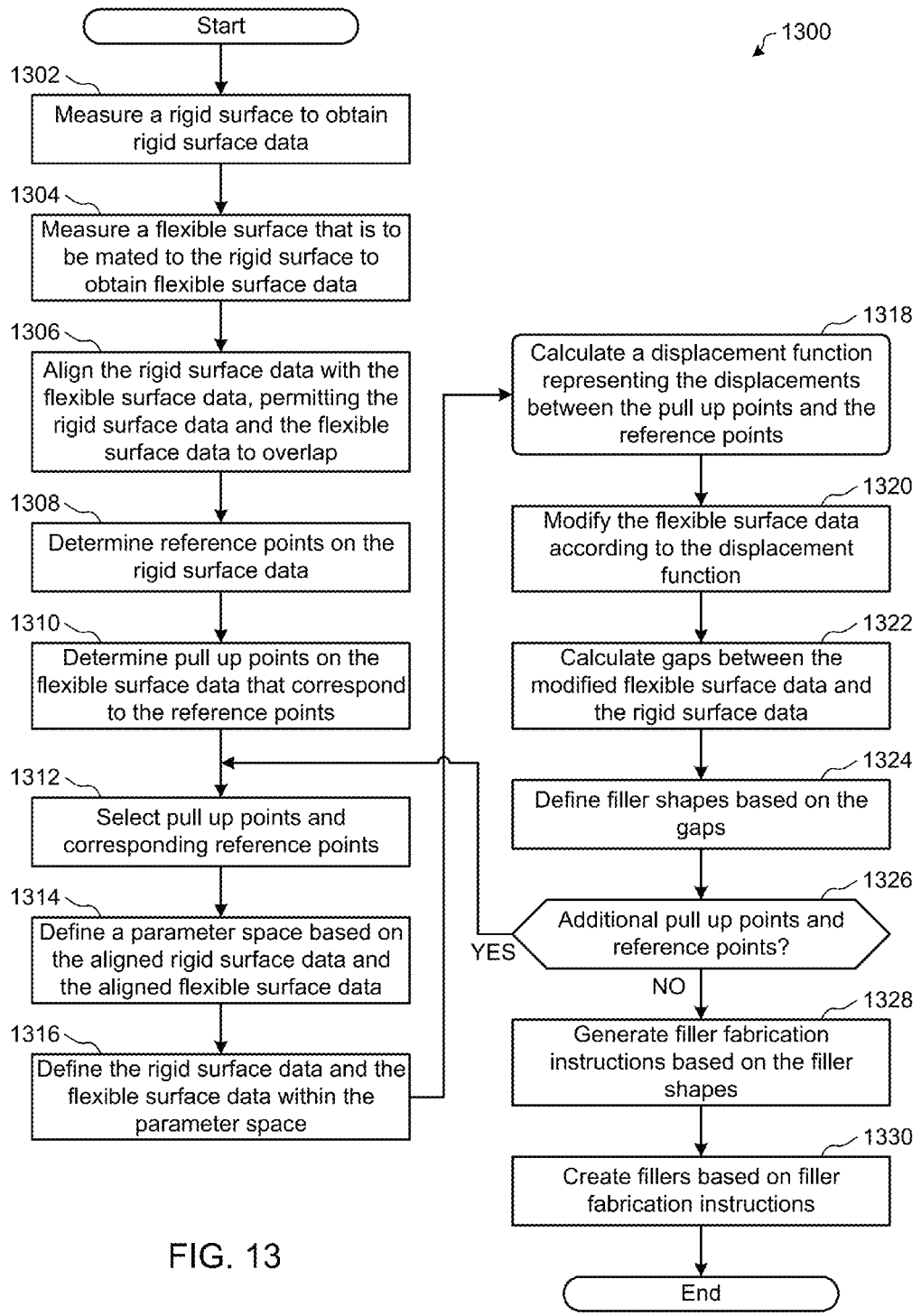
FIG. 13 is a flowchart representative of an example process which may be performed by the example filler generator of FIG. 1 to generate a filler for mating a flexible surface to a rigid surface.
Figure 14:
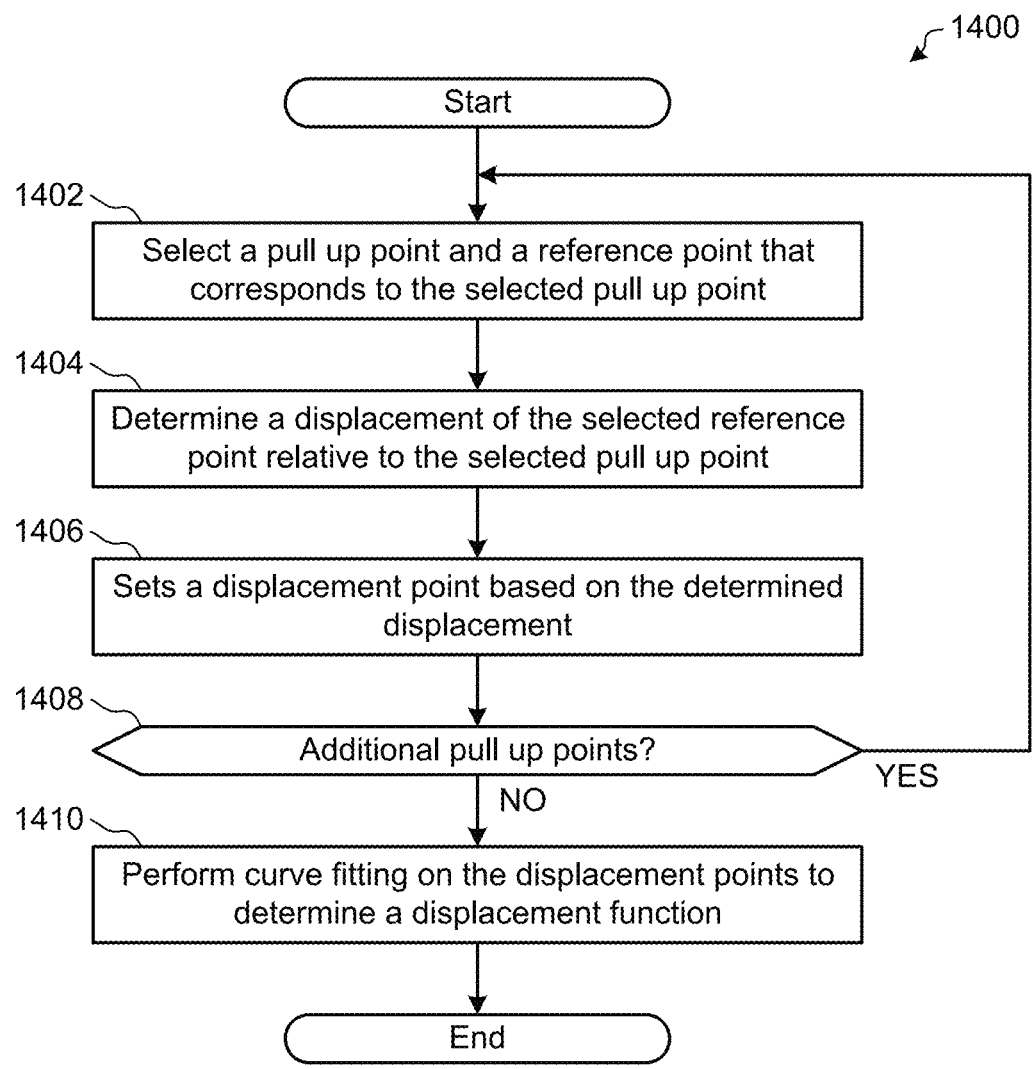
FIG. 14 is a flowchart representative of an example process which may be performed by the example function calculator of FIG. 1 to calculate a displacement function based on the example pull up points, the example reference points, and the example parameter space of FIGS. 1, 7, 8, 9, 10, and 11.

Flowcharts representative of example methods for implementing the filler generator 101 of FIG. 1 are shown in FIGS. 13 and 14. In this example, the methods may be implemented using machine readable instructions that comprise programs for execution by a processor such as the processor 1712 shown in the example processor platform 1700 discussed below in connection with FIG. 17. The programs may be embodied in software stored on a tangible computer readable storage medium such as a CD-ROM, a floppy disk, a hard drive, a digital versatile disk (DVD), a Blu-ray disk, or a memory associated with the processor 1712, but the entire programs and/or parts thereof could alternatively be executed by a device other than the processor 1712 and/or embodied in firmware or dedicated hardware. Further, although the example programs are described with reference to the flowcharts illustrated in FIGS. 13 and 14, many other methods of implementing the example filler generator 101 may alternatively be used. For example, the order of execution of the blocks may be changed, and/or some of the blocks described may be changed, eliminated, or combined.

As mentioned above, the example methods of FIGS. 13 and 14 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and transmission media. As used herein, "tangible computer readable storage medium" and "tangible machine readable storage medium" are used interchangeably. Additionally or alternatively, the example methods of FIGS. 13 and 14 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and transmission media. As used herein, when the phrase "at least" is used as the transition term in a preamble of a claim, it is open-ended in the same manner as the term "comprising" is open ended.

FIG. 13 is a flowchart representative of an example method 1300 that may be performed by the example filler generator 101 of FIG. 1 to generate a filler for mating a flexible surface (e.g., the flexible surfaces 111, 302, 602 of FIGS. 1, 3, and/or 6-12) to a rigid surface (e.g., the rigid surfaces 109, 304, 606 of FIGS. 1, 3, and/or 6-12).

The example measurer 122 of FIG. 1 measures a rigid surface (e.g., the rigid surface 109 of FIG. 1) to obtain rigid surface data (e.g., the rigid surface measurement data 136 of FIG. 1) (block 1302). The example measurer 122 also measures a flexible surface (e.g., the flexible surface 111 of FIG. 1) that is to be mated to the rigid surface 109, to obtain flexible surface data (e.g., the flexible surface measurement data 138 of FIG. 1) (block 1304).

The data aligner 124 aligns the rigid surface data (e.g., the rigid surface measurement data 136 of FIG. 1) with the flexible surface data (e.g., the flexible surface measurement data 138 of FIG. 1), while permitting the rigid surface data and the flexible surface data to overlap (if appropriate) (block 1306). For example, as shown in FIG. 7, the data aligner 124 aligns the flexible surface 602 with the rigid surface 606. The data aligner 124 permits this flexible surface 602 to overlap with the rigid surface 606 when virtually aligned (e.g., to reduce a total distance between the flexible surface 602 and the rigid surface 606.

The pull up selector 126 of FIG. 1 determines reference points on the rigid surface data (e.g., the reference points 802 on the rigid surface 606 of FIG. 8) (block 1308). For example, the pull up selector 126 may determine reference points 802 based on points of the rigid surface 606 that are likely to be in contact with the flexible surface 602 when mated. The pull up selector 126 also determines pull up points on the flexible surface data (e.g., the pull up points 804 on the flexible surface 602) that correspond to the reference points 802 (block 1310). For example, the pull up selector 126 may determine the pull up points 804 using the corresponding locations of the reference points 804 in the aligned rigid surface data 142.

The pull up selector 126 selects pull up points (e.g., the pull up points 804) and reference points 802 that correspond to the selected pull up points 804. In some other examples, the pull up selector 126 selects the reference points 802 and selects the pull up points 804 that correspond to the selected reference points 802.

The parameter definer 128 defines a parameter space (e.g., the parameter space 150 of FIG. 1, the parameter space 700 of FIG. 7) based on the aligned rigid surface data 142 and the aligned flexible surface data 144 (block 1314). For example, the parameter definer 128 may define the u-axis 702 of the parameter space 700 based on the selected pull up points 804 such that each u-axis position has a single rigid surface data point and/or a single flexible surface data point. The parameter definer 128 defines the rigid surface data (e.g., the aligned rigid surface data 142) and the flexible surface data (e.g., the aligned flexible surface data 144) within the parameter space 700 (e.g., the u-axis 702 and the corresponding z-axis 704 of FIG. 7).

The example function calculator 130 calculates a displacement function (e.g., the displacement functions 152, 902 of FIGS. 1, 9, and 10) representing the displacements between the pull up points 804 and the reference points 802 (block 1318). An example process to implement block 1318 is disclosed below with reference to FIG. 14.

The surface data modifier 131 modifies the flexible surface data (e.g., the aligned flexible surface data) according to the displacement function 902 (block 1320). For example, the surface data modifier 131 may determine the morphed surface 1002 by modifying the flexible surface 602 according to the displacement values in the displacement function 902.

The gap calculator 132 calculates gaps (e.g., gaps 1006, 1008 of FIG. 10) between the modified flexible surface data (e.g., the morphed surface 1002) and the rigid surface data (e.g., the rigid surface 606) (block 1322). For example, the gap calculator 132 may calculate gaps for each of the data points in the rigid surface 606. The gap calculator 132 defines filler shapes based on the calculated gaps (block 1324). For example, the gap calculator 132 determines a contour of a filler 120 to be placed in the gap 1006, 1008 based on the calculated gaps and the contour of the rigid surface 606 (e.g., measured by the measurer 122).

The pull up selector 126 determines whether there are additional reference points and/or additional pull up points (block 1326). If there are additional pull up points and/or additional reference points (block 1326), control returns to block 1312 to select different pull up points and reference points. When there are no more pull up points or reference points (e.g., filler shapes have been calculated for all of the gaps in between the flexible surface 602 and the rigid surface 606), the example filler fabricator 134 generates filler fabrication instructions 158 to fabricate the fillers 120 based on the shape data (block 1328).

The example filler fabricator 134 creates the fillers 120 based on the filler fabrication instructions 158 (block 1330). For example, the filler fabricator 134 may instruct a CNC machine, a 3D printer, and/or any other filler fabrication device to fabricate the filler 120 using the filler fabrication instructions 158. The example process 1300 ends and/or iterates to generate additional fillers 120.

FIG. 14 is a flowchart representative of an example method which may be performed by the example function calculator 130 of FIG. 1 to calculate a displacement function based on the example pull up points, the example reference points, and the example parameter space of FIGS. 1, 7, 8, 9, 10, and 11.

The function calculator 130 selects a pull up point (e.g., a pull up point 912 of FIG. 9) and a reference point (e.g., a reference point 914 of FIG. 9) that corresponds to the selected pull up point 912 (block 1402). The function calculator 130 determines a displacement (e.g., a displacement 904, 906, 908 of FIG. 9) of the selected reference point 914 relative to the selected pull up point 912 (block 1404). The displacement 904 is determined as, for example, an amount that the pull up point 912 would have to be moved to match the location of the reference point 914.

The function calculator 130 sets a displacement point (e.g., the displacement point 910 of FIG. 9) based on the determined displacement 904 (block 1406). The function calculator 130 determines whether there are additional pull up points (block 1408). If there are additional pull up points (block 1408), the function calculator 130 returns to block 1402 to select another pull up point 804 and corresponding reference point 802.

When there are no more pull up points (block 1408), the function calculator 130 performs curve fitting on the displacement points (e.g., the displacement points 910, 916, 918) to determine a displacement function (e.g., the displacement function 902 of FIG. 9) (block 1410). For example, the function calculator 130 may perform one or more least squares error curve fitting calculations to determine a function that fits the displacement points 910, 916, 918). In some examples, the function calculator 130 performs piecewise curve fitting and/or modifies an initial curve to ensure that the resulting displacement function 902 fits all of the displacement points 910, 916, 918).

Figure 15:
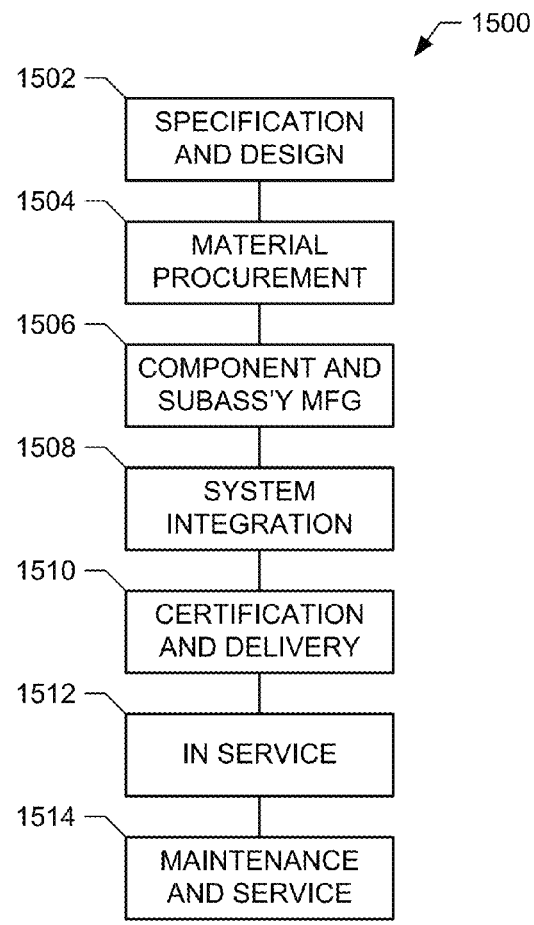
FIG. 15 is a flowchart of platform production and service methodology.
Figure 16:
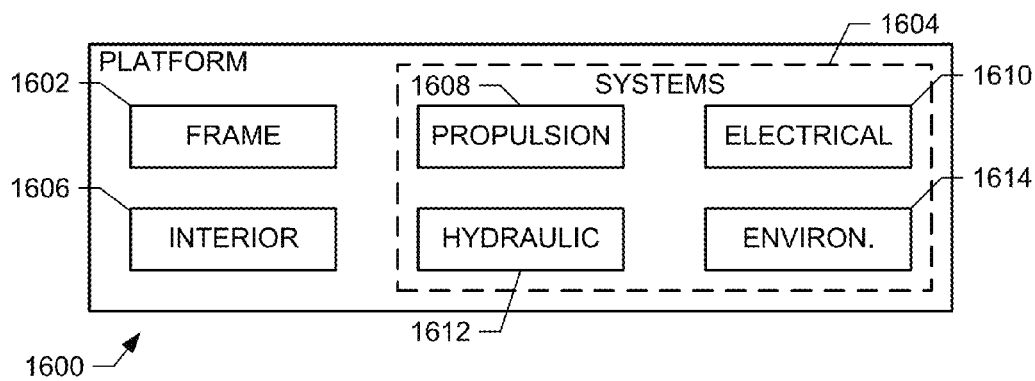
FIG. 16 is a block diagram of a platform.

Examples of the disclosure may be described in the context of a platform manufacturing and service method 1500 as shown in FIG. 15 and a platform 1600, such as an aircraft, as shown in FIG. 16. During preproduction, the example method 1500 may include specification and design (block 1502) of the platform 1600 (e.g., an aircraft). Preproduction may further include material procurement (block 1504). During production, component and subassembly manufacturing (block 1506) and system integration (block 1508) of the platform 1600 (e.g., an aircraft) takes place. The example filler generator 101 of FIG. 1, and/or the example processes 1300, 1400 of FIGS. 13 and/or 14 may be used to implement the production, component, and/or subassembly manufacturing processes of block 1506. Thereafter, the platform 1600 (e.g., an aircraft) may go through certification and delivery (block 1510) in order to be placed in service (block 1512). While in service by a customer, the platform 1600 (e.g., an aircraft) is scheduled for routine maintenance and service (block 1514), which may also include modification, reconfiguration, refurbishment, etc.

Each of the operations of the example method 1500 may be performed or carried out by a system integrator, a third party, and/or an operator (e.g., a customer). For the purposes of this description, a system integrator may include without limitation any number of platform (e.g., aircraft) manufacturers and major-system subcontractors; a third party may include without limitation any number of venders, subcontractors, and suppliers; and an operator may be an airline, leasing company, military entity, service organization, and so on.

As shown in FIG. 16, the platform 1600 (e.g., an aircraft) produced by example method 1500 may include a frame 1602 with a plurality of systems 1604 and an interior 1606. Examples of high-level systems 1604 include one or more of a propulsion system 1608, an electrical system 1610, a hydraulic system 1612, and an environmental system 1614. The example systems and methods disclosed herein may be integrated into the example systems 1604, 1608, 1610, 1612, 1614. Any number of other systems may be included.

Apparatus and methods embodied herein may be employed during any one or more of the stages of the production and service method 1500. For example, components or subassemblies corresponding to production process 1506 may be fabricated or manufactured in a manner similar to components or subassemblies produced while the platform 1600 (e.g., an aircraft) is in service 1512. Also, one or more apparatus embodiments, method embodiments, or a combination thereof may be implemented during the production stages 1506 and 1508, for example, by substantially expediting assembly of or reducing the cost of a platform 1600 (e.g., an aircraft). Similarly, one or more of apparatus embodiments, method embodiments, or a combination thereof may be utilized while the platform 1600 (e.g., an aircraft) is in service 1512, for example and without limitation, to maintenance and service 1514.

Figure 17:
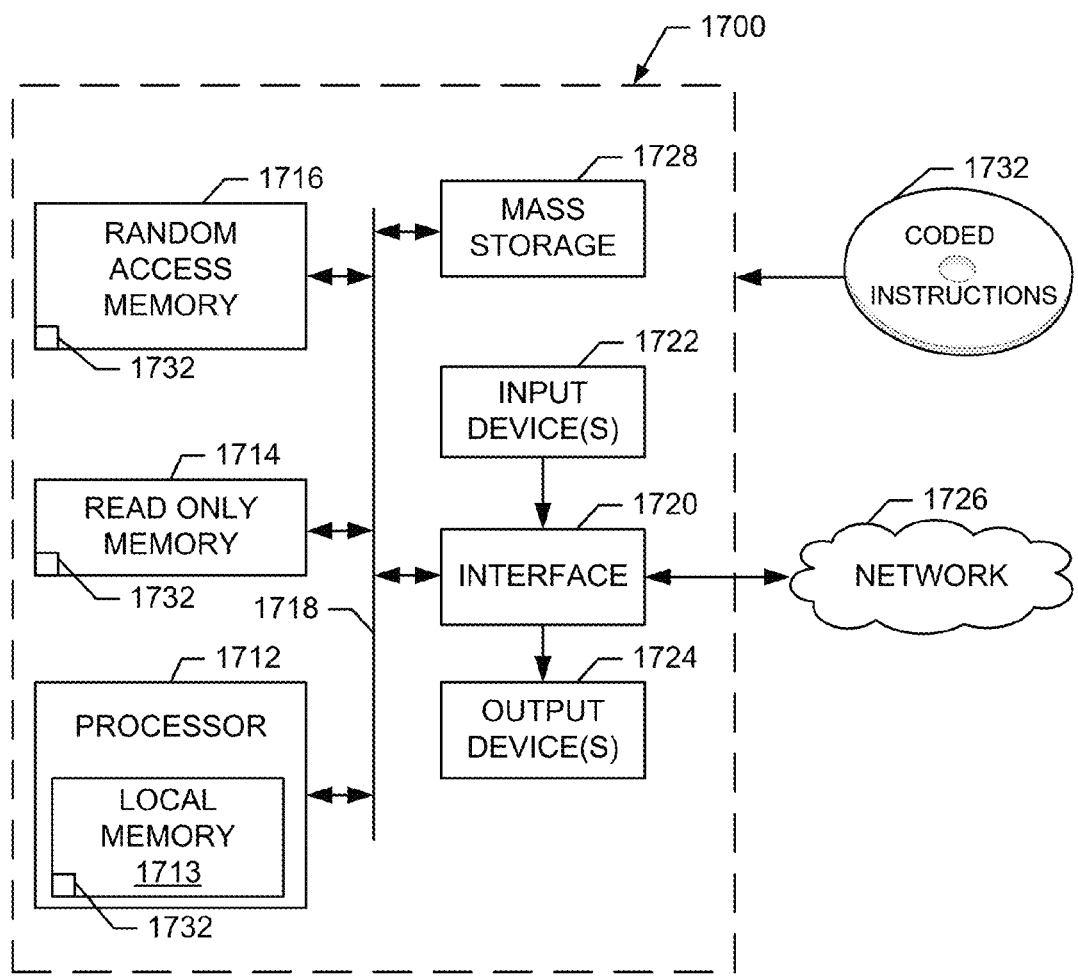
FIG. 17 is a block diagram of an example processor platform capable of executing instructions to implement the methods of FIGS. 13 and/or 14 to implement the example filler generator of FIG. 1.

FIG. 17 is a block diagram of an example processor platform 1700 capable of executing computer readable instructions to implement the methods of FIGS. 13 and/or 14 and/or to implement the filler generator 101 of FIG. 1. The processor platform 1700 can be, for example, a server, a personal computer, a mobile device (e.g., a cell phone, a smart phone, a tablet such as an iPad™), a personal digital assistant (PDA), or any other type of computing device.

The processor platform 1700 of the illustrated example includes a processor 1712. The processor 1712 of the illustrated example is hardware. For example, the processor 1712 can be implemented by one or more integrated circuits, logic circuits, microprocessors or controllers from any desired family or manufacturer.

The processor 1712 of the illustrated example includes a local memory 1713 (e.g., a cache). The processor 1712 of the illustrated example is in communication with a main memory including a volatile memory 1714 and a non-volatile memory 1716 via a bus 1718. The volatile memory 1714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1716 may be implemented by flash memory and/or any other desired type of memory device. Access to the main memory 1714, 1716 is controlled by a memory controller.

The processor platform 1700 of the illustrated example also includes an interface circuit 1720. The interface circuit 1720 may be implemented by any type of interface standard, such as an Ethernet interface, a universal serial bus (USB), and/or a PCI express interface.

In the illustrated example, one or more input devices 1722 are connected to the interface circuit 1720. The input device(s) 1722 permit(s) a user to enter data and commands into the processor 1712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1724 are also connected to the interface circuit 1720 of the illustrated example. The output devices 1724 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1720 of the illustrated example, thus, typically includes a graphics driver card, a graphics driver chip or a graphics driver processor.

The interface circuit 1720 of the illustrated example also includes a communication device such as a transmitter, a receiver, a transceiver, a modem and/or network interface card to facilitate exchange of data with external machines (e.g., computing devices of any kind) via a network 1726 (e.g., an Ethernet connection, a digital subscriber line (DSL), a telephone line, coaxial cable, a cellular telephone system, etc.).

The processor platform 1700 of the illustrated example also includes one or more mass storage devices 1728 for storing software and/or data. Examples of such mass storage devices 1728 include floppy disk drives, hard drive disks, compact disk drives, Blu-ray disk drives, RAID systems, and digital versatile disk (DVD) drives.

Coded instructions 1732 to implement the methods of FIGS. 13 and/or 14 may be stored in the mass storage device 1728, in the volatile memory 1714, in the non-volatile memory 1716, and/or on a removable tangible computer readable storage medium such as a CD or DVD.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method, comprising:
    aligning rigid surface data with flexible surface data using a processor, the rigid surface data and the flexible surface data being permitted to overlap when aligned;
    when aligned, defining the rigid surface data and the flexible surface data based on a same parameter space using the processor;
    calculating, using the processor, a displacement function within the parameter space based on differences between corresponding ones of first points in the flexible surface data and second points in the rigid surface data;
    determining, using the processor, a modified position of a first one of the first points in the flexible surface data by modifying the first one of the first points based on a value of the displacement function at a location corresponding to the first one of the first points;
    calculating, using the processor, a gap between the modified position of the first one of the first points and a second one of the second points corresponding to the first one of the first points; and
    creating a physical filler to fill a physical gap corresponding to the calculated gap.

2. A method as defined in claim 1, wherein the displacement function comprises displacements of the flexible surface data, and determining the modified position of the first one of the first points in the flexible surface data comprises adjusting the value of the first one of the first points according to the displacement represented in the function at the location that corresponds to the first one of the first points.

3. A method as defined in claim 1, further comprising:
    determining third points in the flexible surface data that correspond to fourth points in the rigid surface data;
    defining a second parameter space based on the third points and the fourth points;
    calculating a second displacement function based on second differences between corresponding ones of the third points and the fourth points;
    modifying a third one of the third points based on a second value of the second displacement function at a location of the second displacement function corresponding to the third one of the third points;
    calculating a second gap between the modified position of the third one of the third points and a fourth one of the fourth points corresponding to the third one of the third points; and
    creating a second physical filler to fill a second physical gap corresponding to the calculated second gap.

4. A method as defined in claim 1, wherein the displacement function is defined according to the parameter space.

5. A method as defined in claim 1, wherein calculating the displacement function comprises:
    determining displacements between corresponding ones of the first points and the second points;
    setting measured points in the displacement function, at locations corresponding to the first points and the second points, based on the determined displacements; and
    calculating the displacement function by fitting a curve to the measured points.

6. A method as defined in claim 1, further comprising:
    determining a modified position of the first one of the first points by modifying the first one of the first points based on a value of the displacement function at a location corresponding to the first one of the first points; and
    calculating a set of gaps between modified positions of the first points and second points corresponding to the modified positions, the set of gaps including the gap between the first one of the first points and the second one of the second points, creating the physical filler being based on filling the set of gaps.

7. A method as defined in claim 1, further comprising measuring a first rigid surface to obtain the rigid surface data and measuring a second flexible surface to obtain the flexible surface data.

8. An apparatus, comprising:
    a data aligner to align rigid surface data with flexible surface data, the rigid surface data and the flexible surface data being permitted to overlap when aligned;
    a parameter definer to define a parameter space and to redefine the rigid surface data and the flexible surface data based on the parameter space;
    a function calculator to calculate a displacement function within the parameter space based on differences between corresponding ones of first points in the flexible surface data and second points in the rigid surface data;
    a surface data modifier to determine a modified position of a first one of the first points in the flexible surface data by modifying the first one of the first points based on a value of the displacement function at a location corresponding to the first one of the first points;
    a gap calculator to calculate a gap between the modified position of the first one of the first points and a second one of the second points corresponding to the first one of the first points; and
    a filler fabricator to create a physical filler to fill a physical gap corresponding to the calculated gap, at least one of the data aligner, the parameter definer, the function calculator, the surface data modifier, or the gap calculator being implemented using a logic circuit.

9. An apparatus as defined in claim 8, wherein the displacement function comprises displacements of the flexible surface data, and the surface data modifier is to determine the modified position of the first one of the first points in the flexible surface data by adjusting the value of the first one of the first points according to the displacement represented in the function at the location that corresponds to the first one of the first point.

10. An apparatus as defined in claim 8, further comprising a pull up selector to determine third points in the flexible surface data that correspond to fourth points in the rigid surface data, the parameter definer is to define a second parameter space based on the third points and the fourth points, the function calculator is to calculate a second displacement function based on second differences between corresponding ones of the third points and the fourth points, the surface data modifier is to modify a third one of the third points based on a second value of the second displacement function at a location of the second displacement function corresponding to the third one of the third points, the gap calculator is to calculate a second gap between the modified position of the third one of the third points and a fourth one of the fourth points corresponding to the third one of the third points, and the filler fabricator is to create a second physical filler to fill a second physical gap corresponding to the calculated second gap.

11. An apparatus as defined in claim 8, wherein the function calculator is to define the displacement function according to the parameter space.

12. An apparatus as defined in claim 8, wherein the function calculator is to calculate the displacement function by:
  determining displacements between corresponding ones of the first points and the second points;
  setting measured points in the displacement function, at locations corresponding to the first points and the second points, based on the determined displacements; and
  calculating the displacement function by fitting a curve to the measured points.

13. An apparatus as defined in claim 8, wherein the surface data modifier is to determine a modified position of the first one of the first points by modifying the first one of the first points based on a value of the displacement function at a location corresponding to the first one of the first points, and the gap calculator is to calculate a set of gaps between modified positions of the first points and second points corresponding to the modified positions, the set of gaps including the gap between the first one of the first points and the second one of the second points, the filler fabricator to create the filler based on filling the set of gaps.

14. An apparatus as defined in claim 8, wherein the filler fabricator comprises at least one of a computer numerical control (CNC) milling machine, a CNC routing machine, or a three-dimensional (3D) printer.

15. A tangible computer readable medium comprising computer readable instructions which, when executed, cause a logic circuit to at least:
  align rigid surface data with flexible surface data, the rigid surface data and the flexible surface data being permitted to overlap when aligned;
  when aligned, defining the rigid surface data and the flexible surface data based on a same parameter space;
  calculate a displacement function based on differences between corresponding ones of first points in the flexible surface data and second points in the rigid surface data;
  determine a modified position of a first one of the first points in the flexible surface data by modifying the first one of the first points based on a value of the displacement function at a location corresponding to the first one of the first points;
  calculate a gap between the modified position of the first one of the first points and a second one of the second points corresponding to the first one of the first points; and
  generate second instructions to cause a filler generation machine to create a physical filler to fill a second physical gap corresponding to the calculated gap.

16. A computer readable medium as defined in claim 15, wherein the displacement function comprises displacements of the flexible surface data, and the instructions are to cause the logic circuit to determine the modified position of the first one of the first points in the flexible surface data by adjusting the value of the first one of the first points according to the displacement represented in the function at the location that corresponds to the first one of the first points.

17. A computer readable medium as defined in claim 15, wherein the instructions are further to cause the logic circuit to:
  determine third points in the flexible surface data that correspond to fourth points in the rigid surface data;
  define a second parameter space based on the third points and the fourth points;
  calculate a second displacement function based on second differences between corresponding ones of the third points and the fourth points;
  modify a third one of the third points based on a second value of the second displacement function at a location of the second displacement function corresponding to the third one of the third points;
  calculate a second gap between the modified position of the third one of the third points and a fourth one of the fourth points corresponding to the third one of the third points; and
  generate third instructions to cause a filler generation machine to create a second physical filler to fill a second physical gap corresponding to the calculated second gap.

18. A computer readable medium as defined in claim 15, wherein the instructions are further to cause the logic circuit to measure a first rigid surface to obtain the rigid surface data and measure a second flexible surface to obtain the flexible surface data.

19. A computer readable medium as defined in claim 15, wherein the instructions are to cause the logic circuit to calculate the displacement function by:
  determining displacements between corresponding ones of the first points and the second points;
  setting measured points in the displacement function, at locations corresponding to the first points and the second points, based on the determined displacements; and
  calculating the displacement function by fitting a curve to the measured points.

20. A computer readable medium as defined in claim 15, wherein the instructions are further to cause the logic circuit to:
  determine a modified position of the first one of the first points by modifying the first one of the first points based on a value of the displacement function at a location corresponding to the first one of the first points; and
  calculate a set of gaps between modified positions of the first points and second points corresponding to the modified positions, the set of gaps including the gap between the first one of the first points and the second one of the second points, the instructions to cause the filler generation machine to calculate the filler to fill the set of gaps.

* * * * *